(12) United States Patent
Tokito et al.

(10) Patent No.: US 6,406,801 B1
(45) Date of Patent: Jun. 18, 2002

(54) OPTICAL RESONATOR TYPE ORGANIC ELECTROLUMINESCENT ELEMENT

(75) Inventors: Shizuo Tokito; Koji Noda; Hisayoshi Fujikawa; Yasunori Taga, all of Aichi (JP)

(73) Assignee: Kabushiki Kaisha Toyota Chuo Kenkyusho, Aichi-gun (JP)

( * ) Notice: Subject to any disclaimer, the term of this patent is extended or adjusted under 35 U.S.C. 154(b) by 0 days.

(21) Appl. No.: 09/243,479

(22) Filed: Feb. 3, 1999

(30) Foreign Application Priority Data

Feb. 4, 1998 (JP) .......................................... 10-023692
Jan. 27, 1999 (JP) .......................................... 11-017978

(51) Int. Cl.$^7$ ............................................. H05B 33/12
(52) U.S. Cl. ........................ 428/690; 428/917; 428/212; 313/506; 372/92; 372/98; 372/99; 372/102; 257/98
(58) Field of Search ................................ 428/690, 917, 428/212; 313/506; 372/92, 98, 99, 102; 257/98

(56) References Cited

U.S. PATENT DOCUMENTS 5,780,174 A   7/1998   Tokito et al. ............... 428/690

FOREIGN PATENT DOCUMENTS

| JP | 6-275381 | 9/1994 |
| JP | 6-283270 | 10/1994 |
| JP | 9-180883 | 7/1997 |
| WO | WO 94/07344 | 3/1994 |

OTHER PUBLICATIONS

Takahiro Nakayama, et al., "Organic Photo– and electroluminescent Devices With Double Mirrors", Appl. Phys. Lett. 63 (5), Aug. 2, 1993, pp. 594–595.

Noriyuki Takada, et al., "Control of Emission Characteristics in Organic Thin–Film Electroluminescent Diodes Using and Optical–Microcavity Structure", Appl. Phys. Lett. 63 (15), Oct. 11, 1993, pp. 2032–2034.

S. Tokito, et al., "High Performance Organic Electroluminescent Diodes with Microcavities", Electronics Letters, vol. 32 No. 7, Mar. 28, 1996, pp. 691–692.

A. Dodabalapur, et al., "Electroluminescence From Organic Semiconductors in Patterned Microcavities", Electronics Letters, vol. 30 No. 12, Jun. 9, 1994, pp. 1000–1002.

Tetsuo Tsutsui, et al., "Sharply Directed Emission in Organic Electroluminescent Diodes with an Optical–Microcavity Structure", Appl. Phys. Lett., 65 (15), Oct. 10, 1994, pp. 19–21.

A. Dodabalapur, et al., "Physics and Applications of Organic Microcavity Light Emitting Diodes", J. Appl. Phys. 80 (12), Dec. 15, 1996, pp. 6954–6964.

*Primary Examiner*—Cynthia H. Kelly
*Assistant Examiner*—Ling Xu
(74) *Attorney, Agent, or Firm*—Oblon, Spivak, McClelland, Maier & Neustadt, P.C.

(57) ABSTRACT

An optical resonator type organic electroluminescent element has a multilayered film mirror 30, a transparent electrode 12, an electron hole transportation layer 14 and a luminescent layer 16 configuring an organic layer, and a metallic electrode mirror 20, formed on a glass substrate 10. The optical resonator type organic electroluminescent element amplifies a specific wavelength (especially, in a range of about 30 nm toward a shorter wavelength side from a luminescence peak wavelength of the organic layer) in luminescence light by a minute optical resonator, which comprises the multilayered film mirror 30 and the metallic electrode mirror 20. It is determined that the minute optical resonator has an optical length L which is twice as long as a resonance wavelength, the organic layer has a thickness of 100 nm or more, and the transparent electrode has a thickness of 50 nm or more or a thickness so to have a sheet resistance of 30 Ω/□ or less. Thus, the transparent electrode can be prevented from generating heat even when a large current is caused to flow into it, and the element characteristics can be reliably prevented from being deteriorated. Moreover, the reliability of this element can be improved because the organic layer containing the luminescent layer has a sufficient thickness.

8 Claims, 11 Drawing Sheets

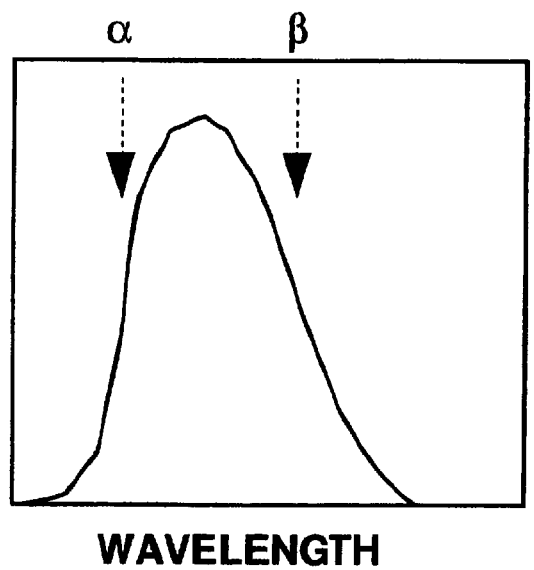
Fig. 9A
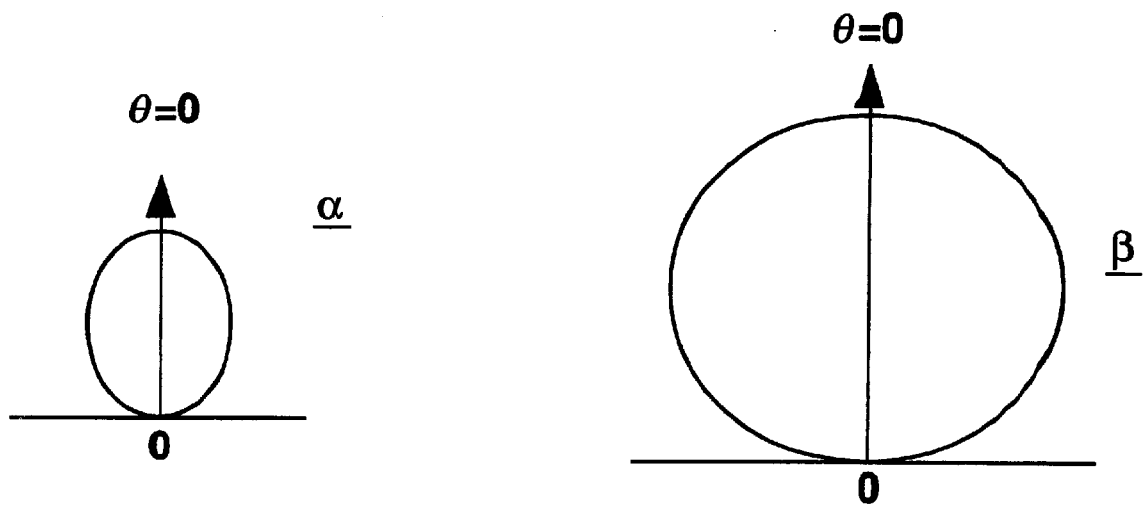
Fig. 9B Fig. 9C

OPTICAL RESONATOR TYPE ORGANIC ELECTROLUMINESCENT ELEMENT

BACKGROUND OF THE INVENTION

1. Field of the Invention

The present invention relates to an optical resonator type organic electroluminescent element (hereafter referred to as the organic EL element), which is provided with a luminescent layer having an organic material held between a pair of electrodes, makes the luminescent layer emit light by injecting a carrier from both electrodes into the luminescent layer, and releases electromagnetic radiation in the form of light by resonating a specific wavelength in the emitted light.

2. Description of the Related Art

Research is being carried out into a flat-panel display in which the organic EL element and a plane source of light are used, as the next generation display materials, and they have attracted considerable attention. A simple dot matrix display is now being developed so as to be put to practical use. The organic EL element has a luminescent layer of an organic material formed between an anode electrode and a cathode electrode, and electrons and electron holes, which are injected from the two electrodes into the luminescent layer, are recombined therein to generate light of a fluorescence spectrum corresponding to the organic material. This light is externally emitted as a natural emitted light without directivity from the organic EL element through a glass substrate.

In order to provide such an organic EL element which can emit light with directivity, there is proposed an organic EL element having a minute optical resonator structure as shown in FIG. 1. The organic EL element having this resonator structure has an electron hole transportation layer 14 and a luminescent layer 16 of the organic material between an anode transparent electrode 12 and a cathode metallic electrode 50, and it also has a multilayered film mirror 40 between a glass substrate 10 and the anode electrode 12. The minute optical resonance structure comprises the multilayered film mirror 40 and the metallic electrode 50, and the light of a specific resonance wavelength, which is defined by a space between the multilayered film mirror 40 and the metallic electrode 50, is amplified. When a luminescent material having a broad emission spectrum is used as the organic luminescent layer 16, however, it is difficult to actually impart directivity to the luminescence light.

It is reported that the directivity of light toward the front of the element can be improved by accurately controlling the space between the multilayered film mirror 40 and the metallic electrode 50, as well as the position of a resonance wavelength, and also determining the optical length to a length of 1.5 times as long as a target wavelength $\lambda$ (JPA (Hei) 9-180883).

However, the above-mentioned organic EL element having an optical length of 1.5$\lambda$ had an anode transparent electrode having a thickness of about 30 nm.

Even if the transparent electrode is ITO (indium tin oxide) having a high electric conductivity, its sheet resistance is as high as 30 $\Omega/\square$, and it is impossible to prevent the generation of Joule heat. For example, when this organic EL element is used as an extremely bright backlight of a liquid crystal display device, even the most highly effective EL element requires a large inflowing current of about 100 mA/cm$^2$ or more. The above-described element is normally driven at a current of 10 mA/cm$^2$ or less as a display or the like. If a much larger current than that is caused to flow, heat generation in the ITO electrode cannot be avoided, and the organic EL element is heavily deteriorated as the temperature becomes higher because its deterioration is directly related to temperature. Experience shows that the lifetime of the element is decreased to $\frac{1}{10}$ as the driving current is increased by ten times.

For example, it is reported in Applied Physics Letter 65(15) "Sharply directed emission in organic electroluminescent diodes with an optical-microcavity structure", Oct. 10, 1994 that use of a special luminescent material (metal complex containing a rare earth element) realizes a high directivity of light toward the front of the element by the ITO anode electrode with a thickness of 158 nm and substantially the same configuration as the conventional one.

However, the special luminescent material described in the above-mentioned document has a low luminous efficiency and unstable chemical performance. Therefore, it does not provide a highly effective element with high brightness. In addition, the organic layer has a total film thickness of 100 nm or less, and the reliability of the element is low in view of a withstand voltage or the like due to a defect or the like, and the organic layer has high probability of a local short-circuit breakdown. Thus, the above-described element is not realistic for practical use.

As described above, an optimum optical resonant organic EL element has not been provided yet, and there is not provided a resonant organic EL element which uses a luminescent material having high luminous efficiency and has high reliability at a large current. Besides, the satisfactory directivity of light toward the front of the element has not been achieved.

SUMMARY OF THE INVENTION

The present invention was achieved to solve the above-mentioned problems, and it is an object of the invention to improve the luminous efficiency and reliability of an organic EL element.

To achieve the above-mentioned object, an organic electroluminescent element having a minute optical resonator for amplifying a specific wavelength in a luminescence light comprising a substrate; a multilayered film mirror formed of laminated layers on the substrate, each of the layers having a different refractive index; a transparent electrode as an anode on the multilayered film mirror; an organic layer on the transparent electrode; and a metallic electrode mirror as a cathode on the organic layer, said organic layer comprising a luminescent layer for emitting a light by injecting electron holes and electrons through the transparent electrode and the metallic electrode mirror, said multilayered film mirror and said metallic electrode mirror constituting a minute optical resonator for amplifying a specific wavelength in the light, wherein the minute optical resonator has an optical length twice as long as a target amplified wavelength, the organic layer is not less than 100 nm thick, and the transparent electrode is not less than 50 nm thick, or is of not more than 30 $\Omega$ in sheet resistance.

The "optical length" of the minute optical resonator is determined by a soaked quantity of light into the multilayered film mirror and an optical thickness of the organic layer (Document: J. Appl. Phys., 80 (1996) 6954). The optical length is determined to be twice-as long as a target amplified wavelength $\lambda$ so to make it possible for the anode transparent electrode and the organic layer to have an appropriate thickness in view of the characteristics of the element.

Specifically, it is characterized by determining the organic layer to have a thickness of 100 nm or more, and the transparent electrode to have a thickness of 50 nm or more or a thickness so to have a sheet resistance of 30 Ω/□ or less. The reliability of the organic layer is improved by determining its thickness to 100 nm or more. Heat generation due to a large current flowing through the element can be suppressed by setting the transparent electrode to have a thickness of 50 nm or more or a thickness so to have a sheet resistance of 30 Ω/□ or less. Thus, the characteristics of the element can be prevented from being deteriorated due to heat generation, and the element can be driven at a large current and readily employed as a lighting device with high brightness.

Moreover, it is suitable in this invention to adjust the above-mentioned target amplified wavelength in a range of about 30 nm toward the side of a shorter wavelength from the luminescence peak wavelength of the luminescent layer.

Because a satisfactory emission intensity or high directivity cannot be obtained if the target amplified wavelength is more than 30 nm away from the luminescence peak wavelength of the luminescent layer, the conditions described above are preferably determined so that a satisfactory emission intensity can be obtained, and light having high directivity can be emitted from the element.

It is more suitable to set the transparent electrode to have an optical thickness of $\lambda/2$ for example. Here, an optical thickness L of the film is expressed in $L=D \times n$ (n: a refractive index) with respect to an actual thickness D of the film. By setting it as described above, the transparent electrode has an actual thickness of about 129 nm (actual thickness is a value resulting from dividing the optical thickness by its refractive index (=1.93)) when the target amplified wavelength $\lambda$ is for example 500 nm, and a sheet resistance of about 15 Ω/□ can be achieved.

Moreover, it is desirable to use the luminescent material with a narrow emission spectrum to configure the organic layer in order to additionally enhance the luminescence color purity of the organic EL element. For example, it is desirable to use a luminescent material such as quinacridone having a half-width of about 80 nm or less.

BRIEF DESCRIPTION OF THE DRAWINGS

FIG. 9A is a diagram showing a position of the target amplified wavelength determined with respect to the peak wavelength of the emission spectrum of the luminescent layer;

FIG. 9B and FIG. 9C are diagrams illustrating characteristics of the emitted light obtained when the target amplified wavelength is determined as shown in FIG. 9A;

DESCRIPTION OF THE PREFERRED EMBODIMENTS

Preferred embodiments of the present invention will be described with reference to the accompanying drawings.

Figure 1:
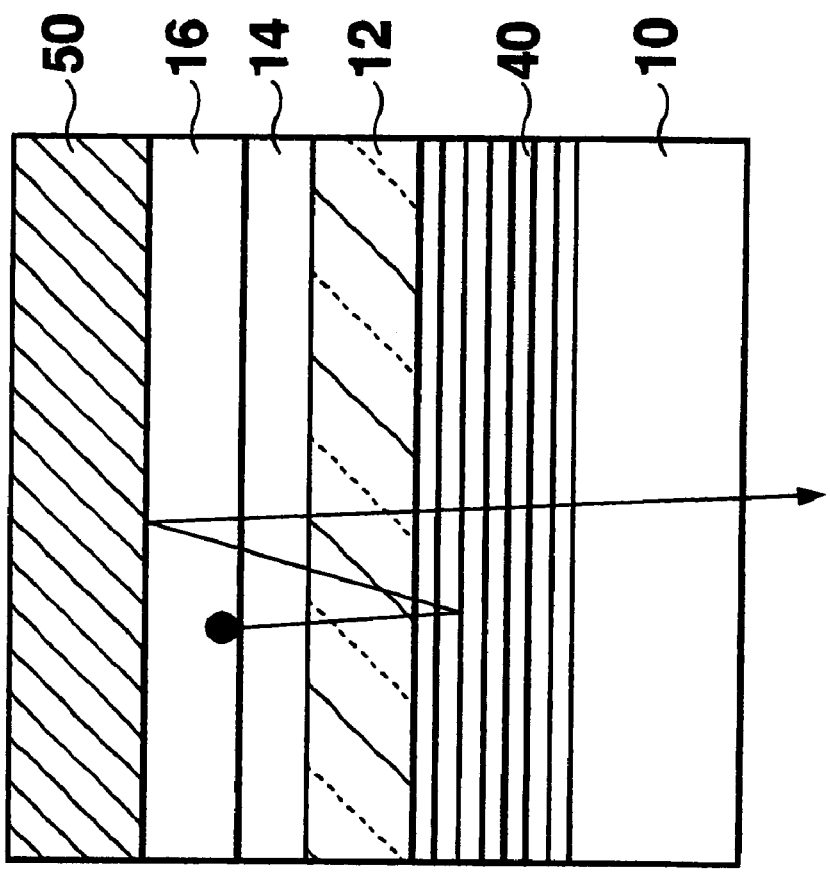
FIG. 1 is a diagram showing the configuration of a general minute optical resonator type organic EL element.
Figure 2:
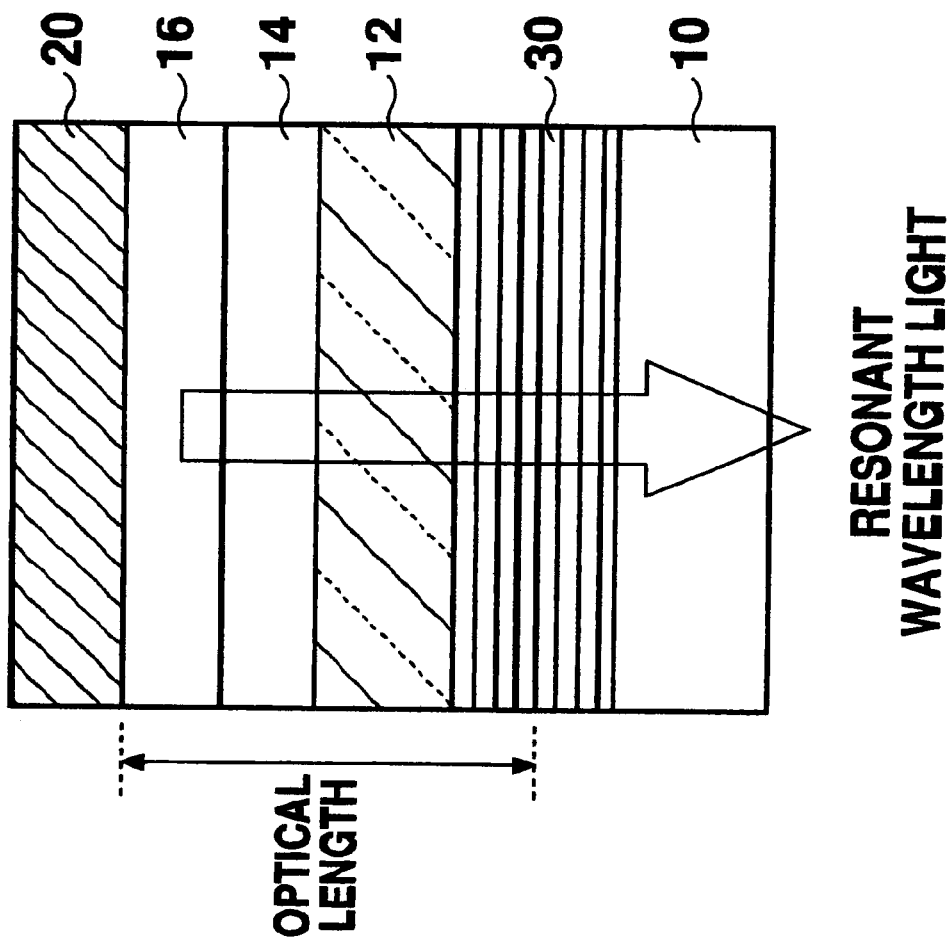
FIG. 2 is a diagram showing the configuration of the minute optical resonator type organic EL element according to Embodiment 1 of the present invention.

FIG. 2 is a diagram showing the configuration of the minute optical resonator type organic EL element according to this embodiment-. The organic EL element of this embodiment has a multilayered film mirror (dielectric mirror) 30, which is formed by laminating two kinds of layers having a different refractive index into a plurality of layers, formed on a glass substrate 10. A transparent electrode 12 using ITO (indium tin oxide), $SnO_2$, $In_2O_3$ or the like is formed as an anode on the multilayered film mirror 30. Moreover, an organic layer, which contains a luminescent layer 16 and an electron. hole transportation layer 14, is formed on the transparent electrode 12, and a metallic electrode mirror 20 is formed of Ag, MgAg, AlLi or Al with LiF as a cathode electrode on the organic layer.

A minute optical resonator comprises the multilayered film mirror 30 and the metallic electrode mirror 20, and its optical length is a sum of a quantity of light soaked into the multilayered film mirror 30 and an optical thickness of the transparent electrode 12 and the organic layer. In this embodiment, the optical length is set to twice as long as a target amplified wavelength (resonance wavelength) $\lambda$, and the transparent electrode 12 is determined to have a thickness of 50 nm or more or a thickness so to have a sheet resistance of 30 Ω/□ or less. In addition, the organic layer is determined to have a total thickness (the total thickness of the luminescent layer 16 and the electron hole transportation layer 14) 100 nm or more.

The sheet resistance becomes 30 Ω/□ or more even if ITO is used as the transparent electrode when the optical length is 1.5$\lambda$ and the transparent electrode has a thickness of about 30 nm as in the conventional art. Meanwhile, it is determined in this embodiment that the optical length is two times longer than the target amplified wavelength $\lambda$, and the transparent electrode 12 has a thickness of 50 nm or more or a thickness so to have a sheet resistance of 30 Ω/□ or less.

Figure 3:
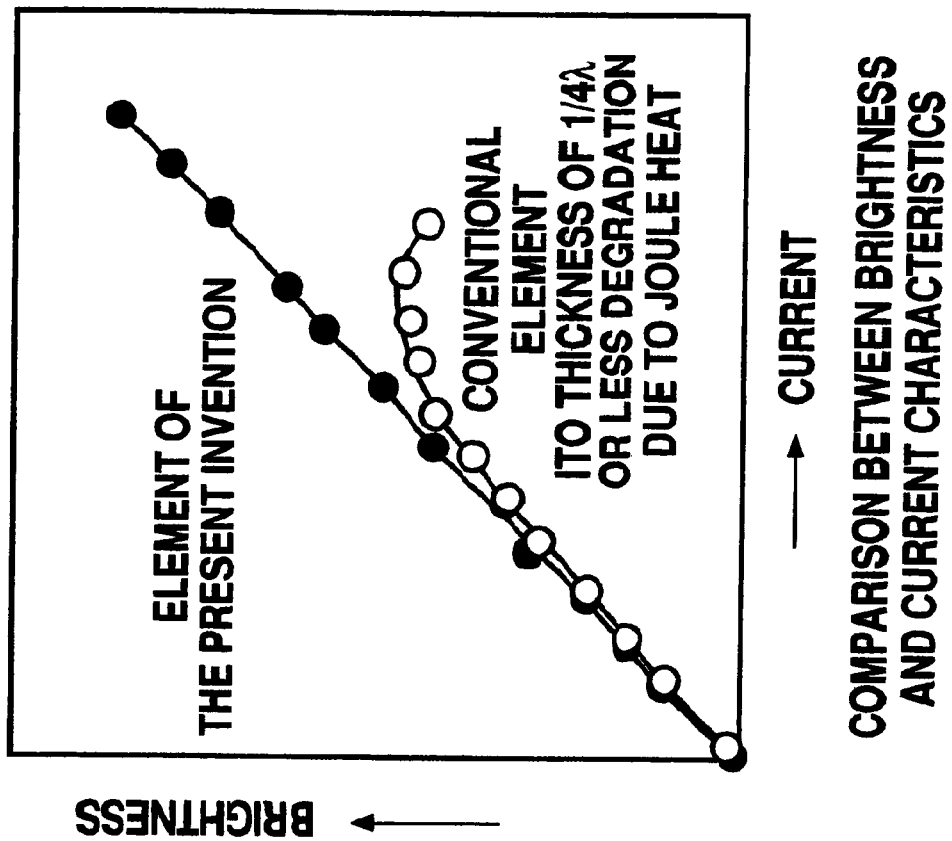
FIG. 3 is a diagram showing brightness and current characteristics of the organic EL element of the invention compared with that of a conventional organic EL element for brightness and current characteristics.

Especially, it is desirable to determine the transparent electrode 12 to have a thickness of $\lambda/2$. When the transparent electrode 12 has a thickness of $\lambda/2$ as above, its resistance can be decreased to half, and the Joule heat generated in the transparent electrode 12 using ITO can be decreased to ¼ even by a simple calculation. FIG. 3 shows the brightness and current characteristics of the element when the ITO transparent electrode as a thickness of λ/4 or less as. in the conventional art and those of the element when ITO is used as the transparent electrode 12 and its thickness is λ/2 as in the present embodiment. When a large current is caused to flow through the conventional element, it is deteriorated by the Joule heat to lower its brightness. However, the element of this embodiment is hardly deteriorated by having a large current flow, and higher luminescence brightness is obtained with the increase of the amount of the current. Thus, the element can be reliably prevented from having an increased temperature by increasing the thickness of the transparent electrode 12 so to have a very low sheet resistance, and stable light emission with high brightness can be carried out for a long time.

Moreover, the entire organic layer is determined so as to have a thickness of 100 nm or more so that a local short-circuit breakdown in the organic EL element can be prevented, and the reliability of the element is secured.

Figure 4B:
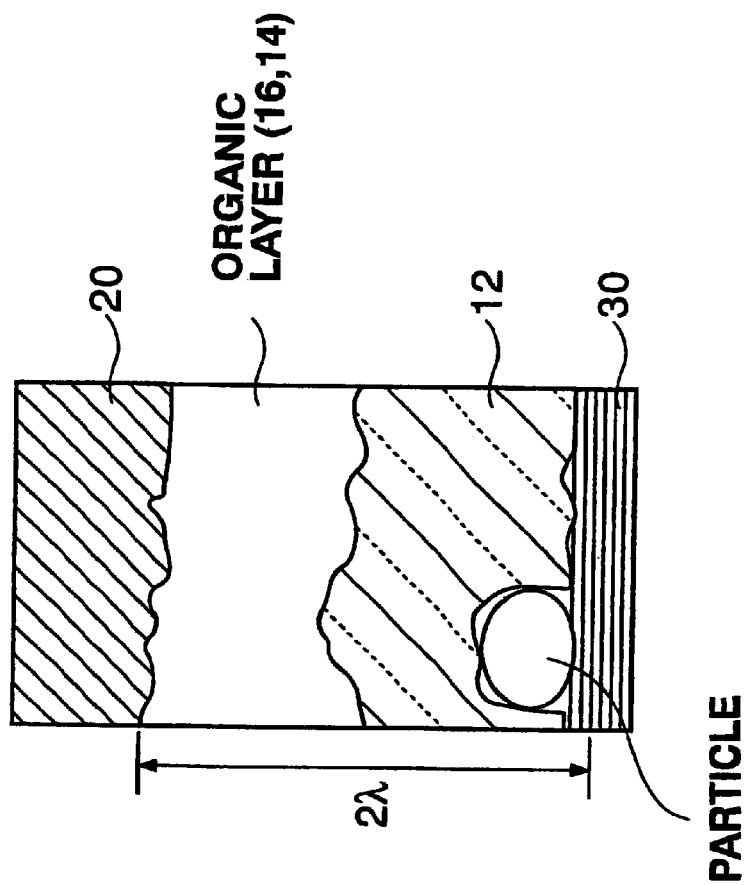
FIGS. 4A and 4B are conceptual diagrams for illustrating differences of characteristics between the organic EL element of the invention and the conventional organic EL element due to the structural differences.
Figure 4A:
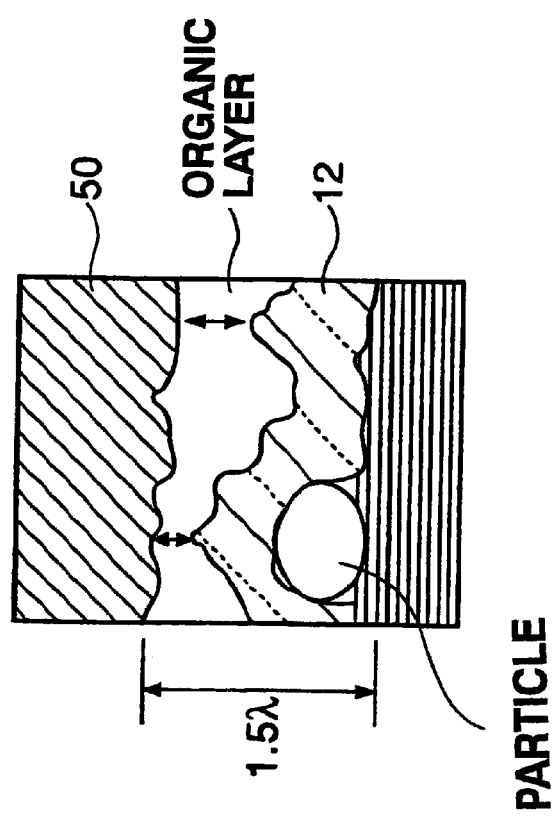

FIG. 4A and FIG. 4B conceptually show differences of actions between the resonator type organic EL element having an optical length of 1.5λ and the resonator type organic EL element having an optical length of 2λ as in this embodiment. As shown in FIG. 4A, the element having the optical length of 1.5λ may have a high resistance because the transparent electrode 12 is thin, and since the organic layer is thin in addition, the transparent electrode 12 and the metallic electrode 50 might be partially short-circuited due to projections of the electrode layer or adhesion of dust or the like. One of the reasons that the conventional element has a short lifetime is that such a short-circuit is caused with a lapse of driving time. On the other hand, as shown in FIG. 4B, the element of this embodiment has an optical length of 2λ, and the transparent electrode 12 and the organic layer also have a sufficient thickness as described above. Therefore, it is unlikely that the electrodes are short-circuited due to the presence of dust or the projections of the electrode layer. In view of the reasons described above, the element of this embodiment can have a long service lifetime as described above.

Figure 5:
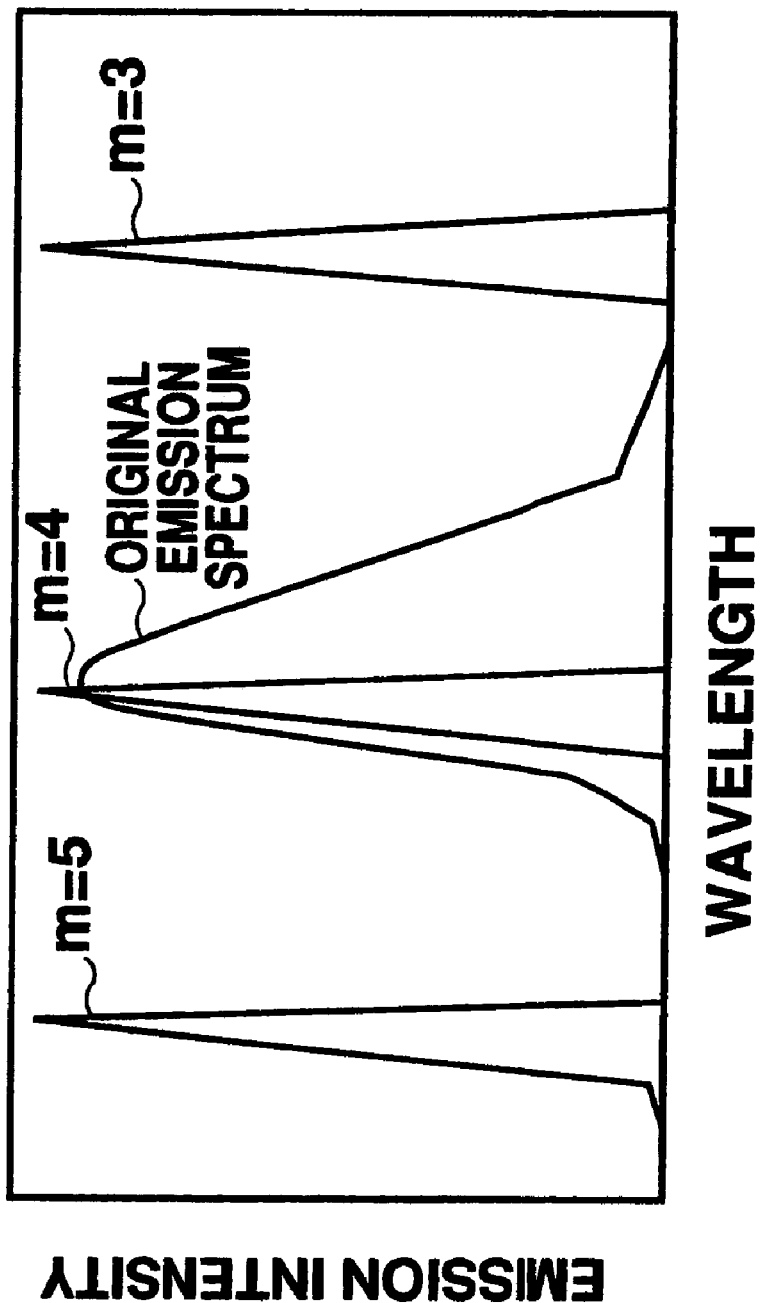
FIG. 5 is a diagram showing a positional relationship between the emission spectrum and the resonance wavelength of the luminescent layer of the minute optical resonator type organic EL element according to the embodiment of the invention.

When the optical length is 2λ as described above, a resonance mode m to be used becomes 4, namely a fourth mode in view of the optical length L=m·λ/2 In this case, a low luminescence peak (low-level mode), for example, the resonance mode of m=3, 5, is generated near the use mode as shown in FIG. 5. Also, when it is set to overlap with a steep area on the shorter wavelength side of the emission 1 spectrum of the luminescent material which uses the fourth target amplified wavelength, the resonance wavelength of the third mode appears on the long wavelength side of the fourth mode. Then, it is desirable to use the former luminescent material having a narrow spectrum for the luminescent layer 16 so that no other low-level mode should enter the emission spectrum. In other words, the luminescent material has a small half-width of the emission spectrum (a width with which the maximum peak value becomes half).

For example, the luminescent material to be used preferably has an emission spectrum not overlapping with 650 nm and a half-width of 80 nm or less. The luminescent material satisfying the requirements described above contains quinacridone (half-width of 80 nm) expressed by the following chemical formula (1) for example.

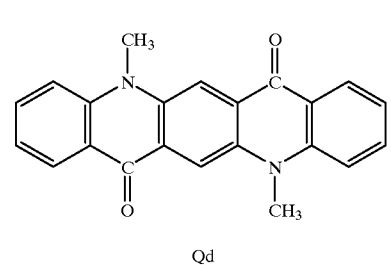

(1)

Qd

Figure 6:
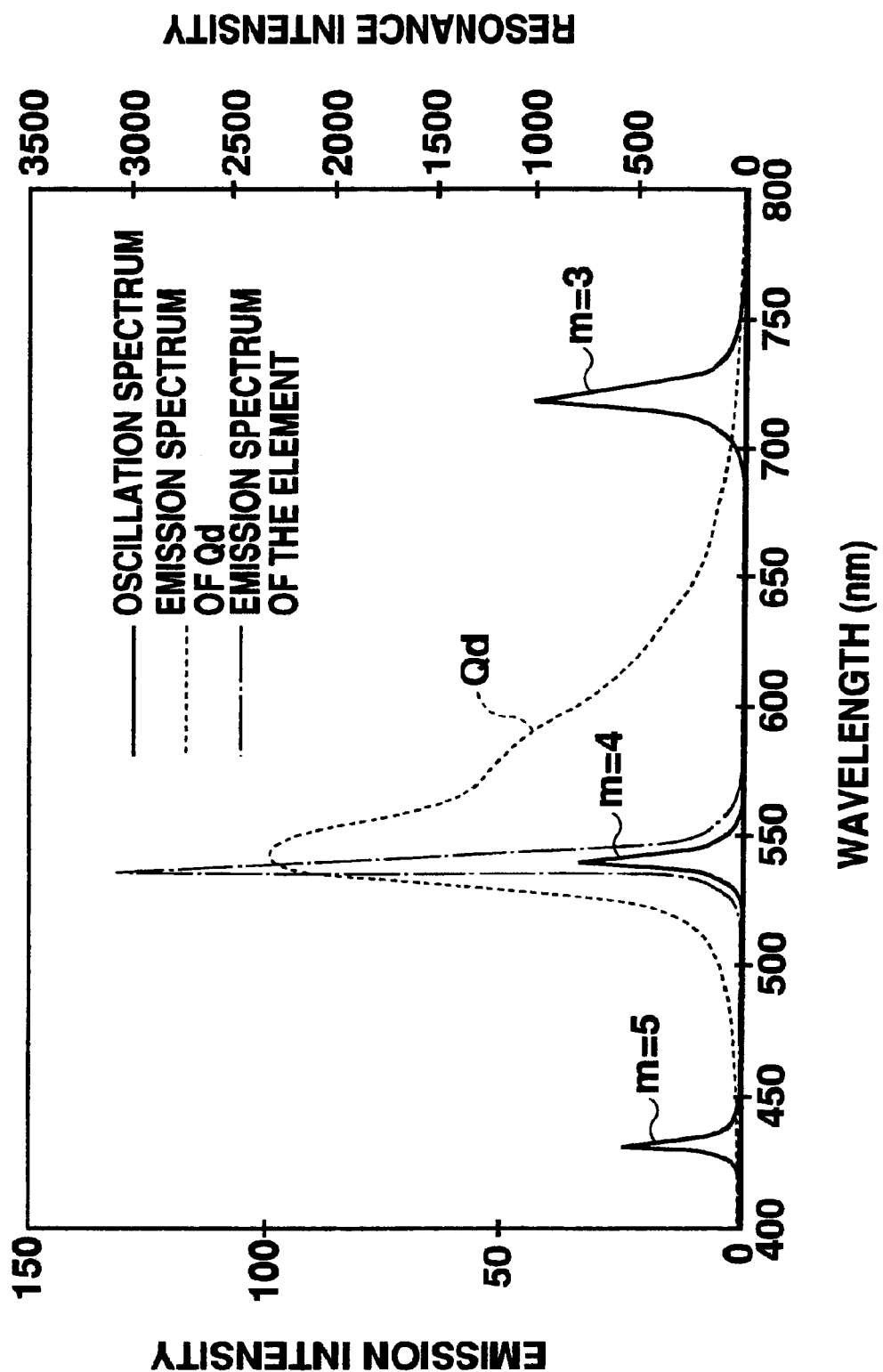
FIG. 6 is a diagram showing the emission spectrum of the minute optical resonator type organic EL element when quinacridone is used as the luminescent layer.
Figure 7:
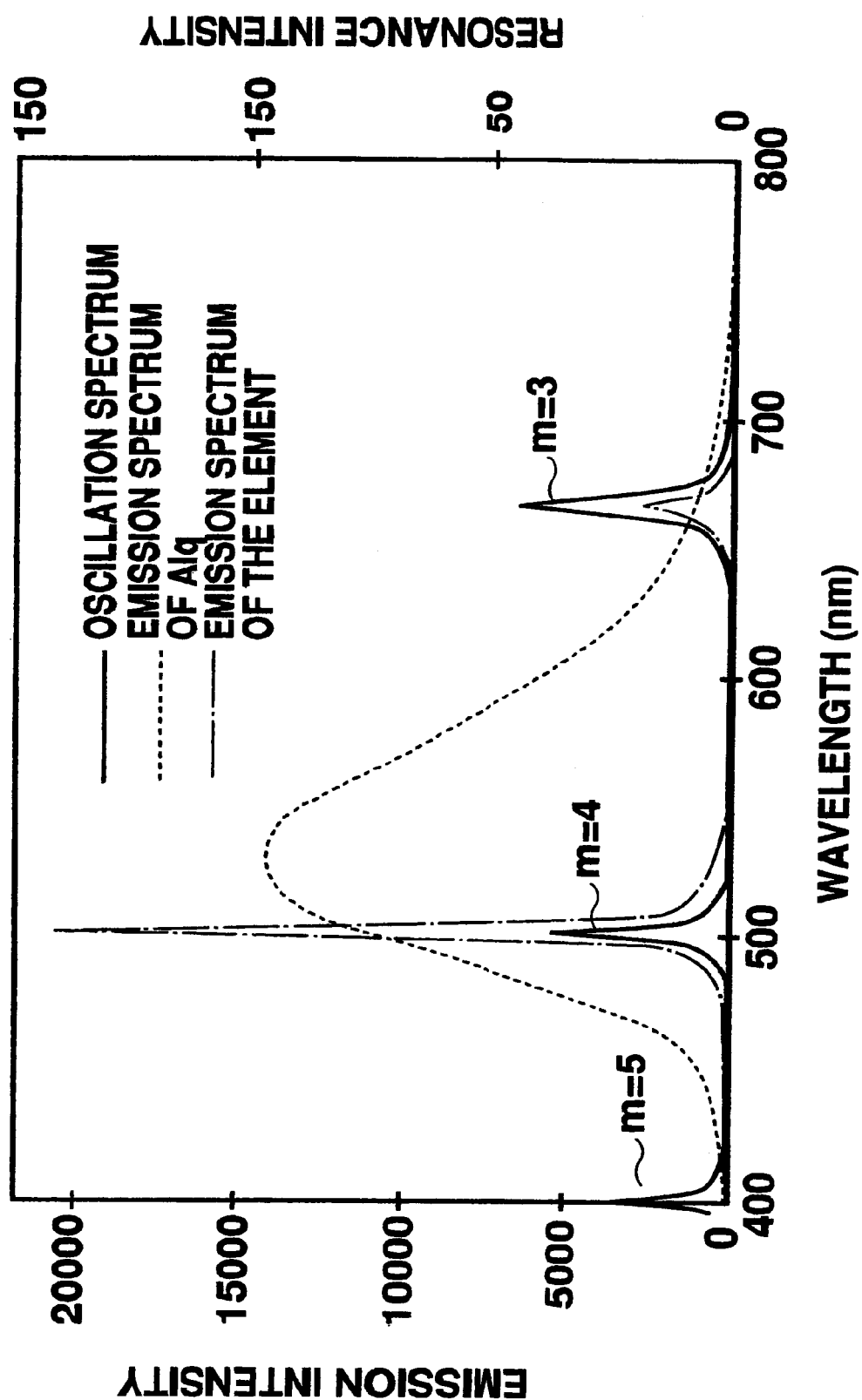
FIG. 7 is a diagram showing the emission spectrum of the minute optical resonator type organic. EL element when alumiquinolinol complex is used as the luminescent layer.

FIG. 6 shows a relationship between a wavelength and an emission intensity (left vertical axis) under conditions that a target amplified wavelength is determined to 535 nm, the luminescent material containing the above-mentioned quinacridone is used as the luminescent layer, the organic layer has a thickness of 140 nm and the ITO electrode has a thickness of 150 nm. FIG. 7 shows a relationship between a wavelength and an emission intensity (left vertical axis) under conditions that the target amplified wavelength is 500 nm, the luminescent layer is Alq, the organic layer has a thickness of 115 nm, the ITO electrode has a thickness of 150 nm, and an $SiO_2$ film and a $Tio_2$ film are each formed in four layers to configure the multilayered film mirror. Right vertical axes in FIG. 6 and FIG. 7 show resonance strengths (arbitrary unit a.u.) with m=5, 4 and 3.

As indicated by the dotted line in FIG. 6, quinacridone has an emission spectrum of 650 nm or less and a half-width of 80 nm or less, and its spectrum does not overlap with the third peak generated in the neighborhood of 720 nm. Therefore, the emission spectrum of the resonant organic EL element finally obtained has its set wavelength in the neighborhood of 535 nm selectively amplified as indicated by broken chain line in FIG. 6. When alumiquinolinol complex (Alq) indicated by the chemical formula (2) below is used, its emission spectrum has a large half-width and the spectrum also exists in the vicinity of 650 nm as indicated by a dotted line in FIG. 7. Also, the resonance wavelength of the third mode has been m0 contained in this emission spectrum. Therefore, the optical resonant organic EL element using Alq as the luminescent layer also emits at the resonance wavelength of the third mode as indicated by broken chain line in FIG. 7. Therefore, color purity is lowered, and the directivity toward the front of the element can not be obtained.

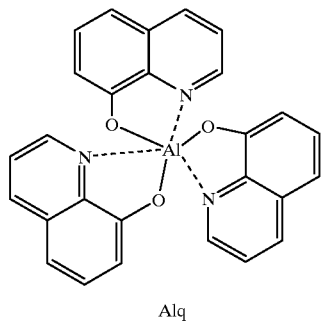

(2)

Alq

Because a red luminescent element in a low-level mode emits in an infrared region (700 nm or more), a luminescent material with a large half-width can be used without involving any problem in a visual (for non-visual light for person).

As a material for the luminescent layer 16, for example, perylene expressed by the chemical formula (3), an oxadiazol-based material expressed by the chemical formula (4), or distilarylene)-based material expressed by the chemical formula (5) can be used to emit blue light. Phthalocyanine expressed by the chemical formula (6) or DCM2(5) expressed by the chemical formula (7) can be used to emit red light.

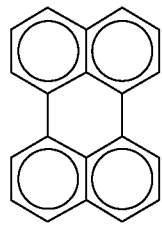

(3)

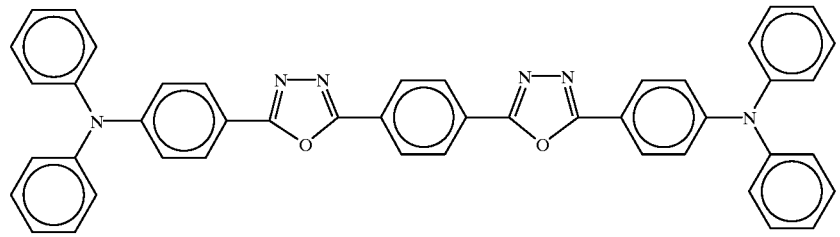

(4)

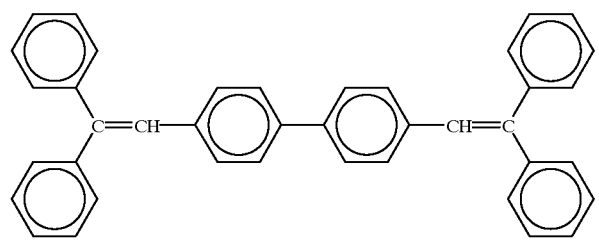

(5)

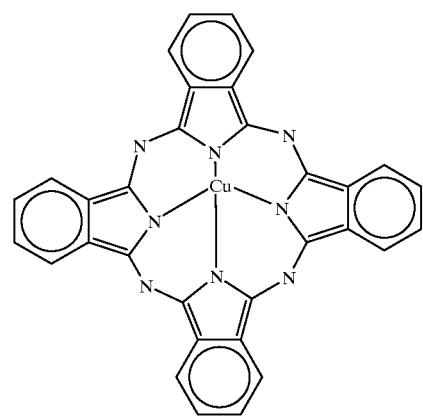

(6)

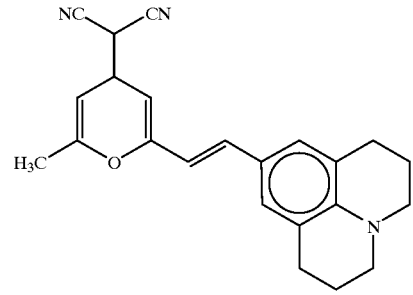

(7)

Moreover, the electron hole transportation layer 14, which constitutes the organic layer with the luminescent layer 16, is mainly composed of an aromatic amine-based material, such as TPTE (triphenylamine tetramer) expressed by the chemical formula (8) or α-NPB(Bis[N-(1-naphthyl)-N-phenyl] benzidine).

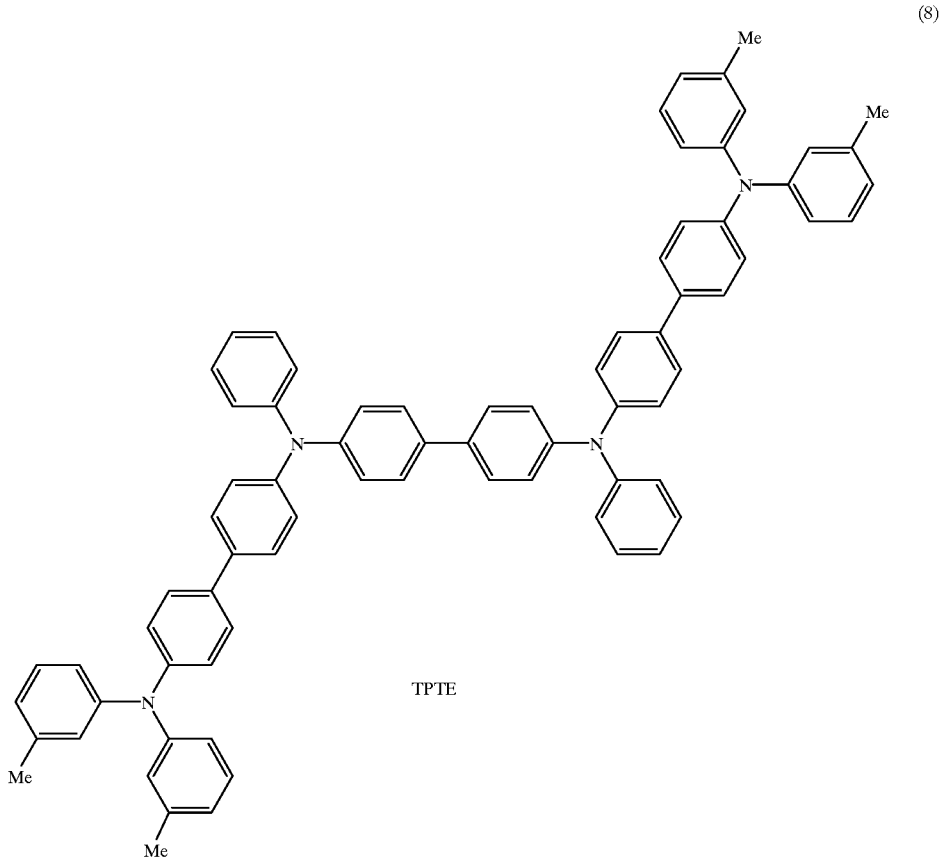

TPTE (8)

Moreover, the organic layer comprises the luminescent layer and the electron hole transportation layer. In order to further facilitate the injection of the electrons into the luminescent layer, it is preferable that an electron transportation layer using an organic material is formed between the luminescent layer and the metallic electrode mirror or an electron injection layer which consists of the oxide or fluoride of alkaline metal or alkaline-earth metal is formed therebetween.

In this embodiment, the target amplified wavelength is determined to be about 30 nm toward the short wavelength side of the emitted peak wavelength of the luminescent layer as described above, and the reasons for doing so are given below.

Figure 8:
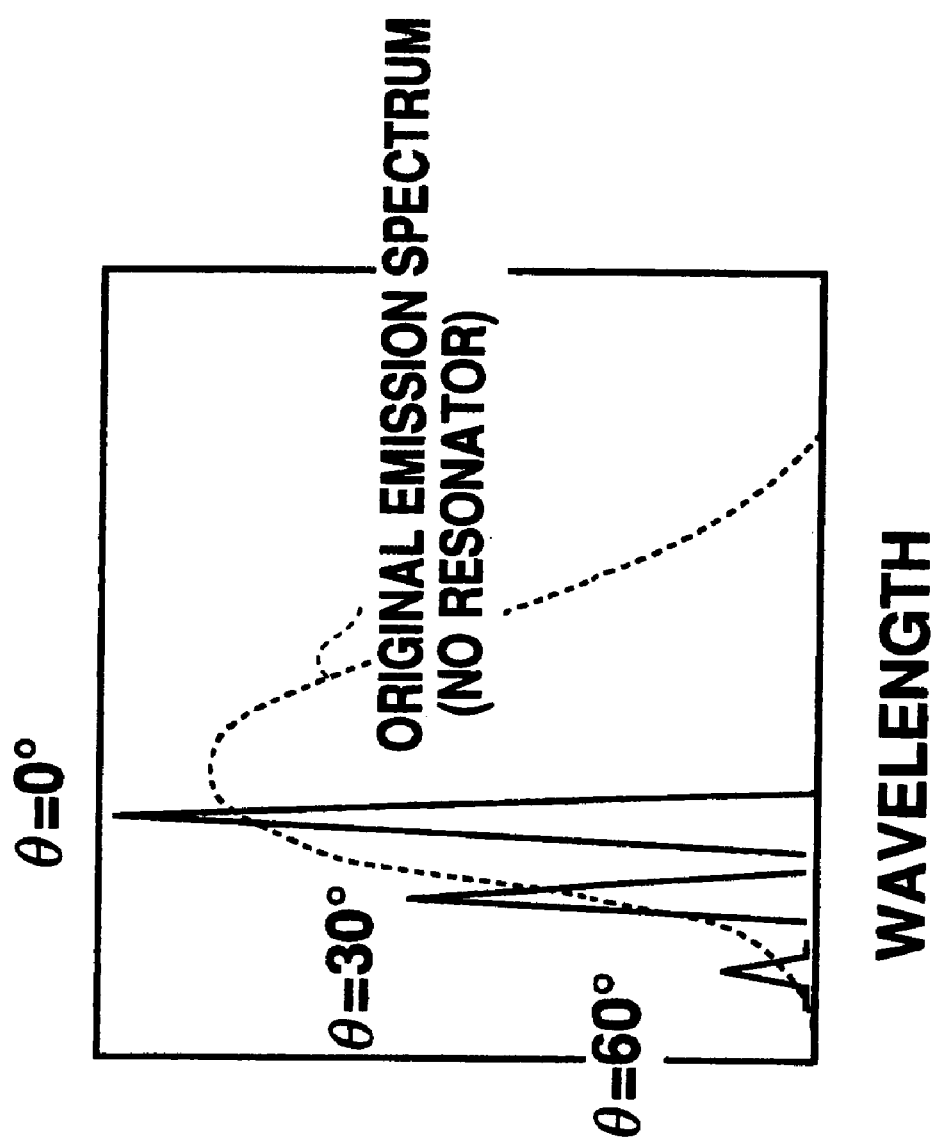
FIG. 8 is a diagram showing an emission spectrum of the luminescent layer and its angle dependency.

The target amplified wavelength is a wavelength (resonance wavelength) resonant with the resonator (organic EL element) and variable depending on an angle that it is observed. For example, as shown in FIG. 8, when the observing direction is changed from the front (θ=0°) of the resonator to its diagonal direction (e.g., θ=30°, 60°), the target amplified wavelength shifts toward the shorter wavelength side. Accordingly, when the target amplified wavelength is determined to be positioned far away from the luminescence peak of the luminescent layer, the emission intensity (amplified light intensity) lowers, and the directivity is lost as the whole. For example, when the emission spectrum of the luminescent layer has the characteristics as indicated by the solid line in FIG. 9A and the target amplified wavelength is determined to be at position (α) longer than 30 nm toward the shorter wavelength side from the luminescence peak, the directivity of the emitted light from the resonant organic EL element is very small as shown in FIG. 9B. Meanwhile, when the target amplified wavelength is determined on the longer wavelength side from the luminescence peak, such as position (β), as shown in FIG. 9A, the directivity is lost as shown in FIG. 9C. Besides, when the target amplified wavelength is largely separated toward the long wavelength side from the luminescence peak, the emission spectrum itself of the luminescent layer in that region is small, so that the emitted light intensity itself at the front of the element also becomes small.

The directivity of the emitted light obtained by resonating becomes higher as the material for the luminescent layer has a steeper property on the short wavelength side of the luminescence peak. As described above, this embodiment uses a luminescent material which has as steep a luminescence property as possible for the luminescent layer. Accordingly, the intensity of the emission spectrum of the luminescent layer itself is extremely small at a position more than 30 nm away toward the short wavelength side from the luminescence peak, and a satisfactory emission intensity cannot be obtained even if such a wavelength is determined as the target amplified wavelength. For example, in FIG. 6, quinacridone Qd has a luminescence peak wavelength of 540 nm, the short wavelength side 30 nm away from there is 510 nm, where the emission intensity of the original emission spectrum is only 1/30 of the peak strength. Therefore, the target amplified wavelength is preferably determined to fall in a range of within 30 nm toward the short wavelength side from the luminescence peak wavelength.

Figure 10B:
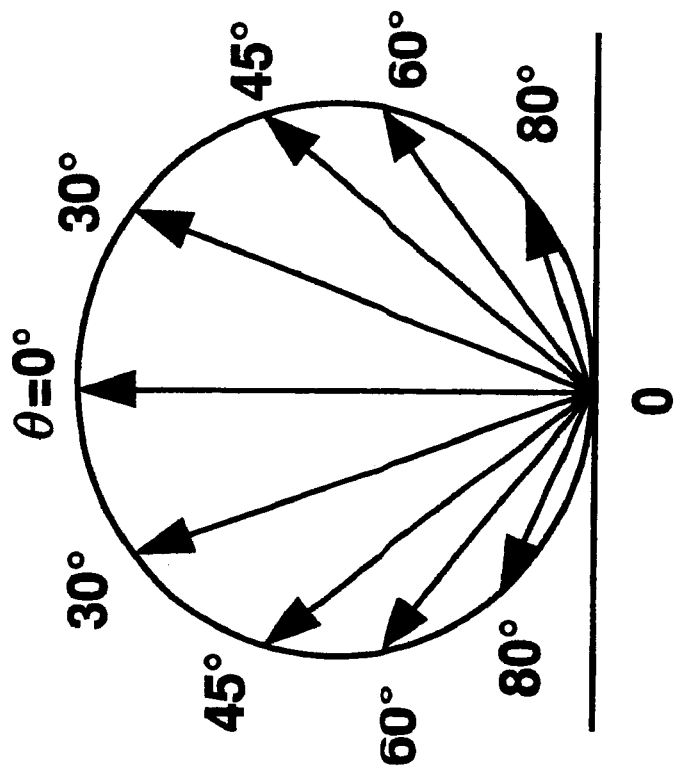
FIG. 10A and FIG. 10B are diagrams illustrating an emission intensity and directivity of the emitted light obtained when the target amplified wavelength is determined to be on the side of a longer wavelength of the peak wavelength of the emission spectrum of the luminescent layer.
Figure 10A:
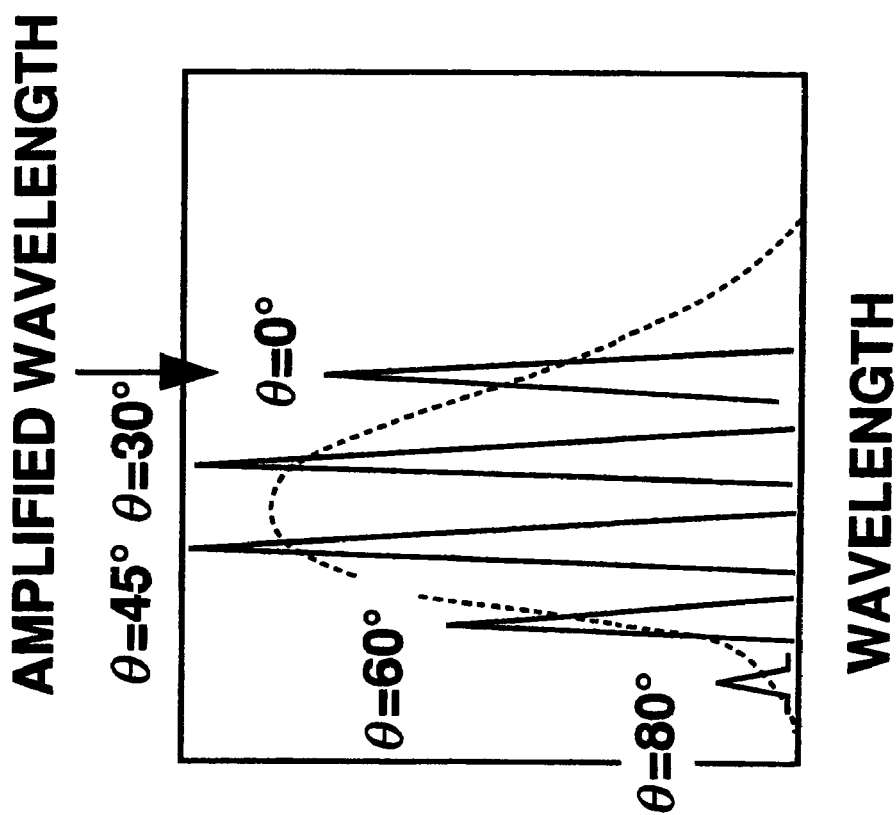

By determining the target amplified wavelength to be within about 30 nm toward the long wavelength side from the luminescence peak wavelength, emission of light itself can be obtained, but the directivity is not obtained as shown in FIG. 9C as described above. FIGS. 10A and 10B specifically show the state described above. As shown in FIG. 10A, when the target amplified wavelength is determined on the long wavelength side of the luminescent layer and the observing direction is changed to shift the wavelength of the emitted light with the target amplified wavelength to the short wavelength side as described above, a region having a high emission intensity containing the luminescence peak of the original emission spectrum of the luminescent layer is on the short wavelength side of the shifted target amplified wavelength. Accordingly, as shown in FIGS. 10A and 10B, the emission intensity at oblique angles (e.g., θ=30°, 45°, 60°) also becomes high with respect to the emission intensity observed at the front (θ=0°) of the resonant organic EL element. In other words, when observed obliquely, light with the corresponding wavelength having a high emission intensity is observed, and sufficient directivity toward the front of the element cannot be obtained. Thus, it becomes necessary to separately split the light being emitted from the element.

As described above, the satisfactory emission intensity and directivity can be obtained by determining the target amplified wavelength to be within 30 nm on the short wavelength side of the luminescence peak of the luminescent layer.

EXAMPLE

Figure 11:
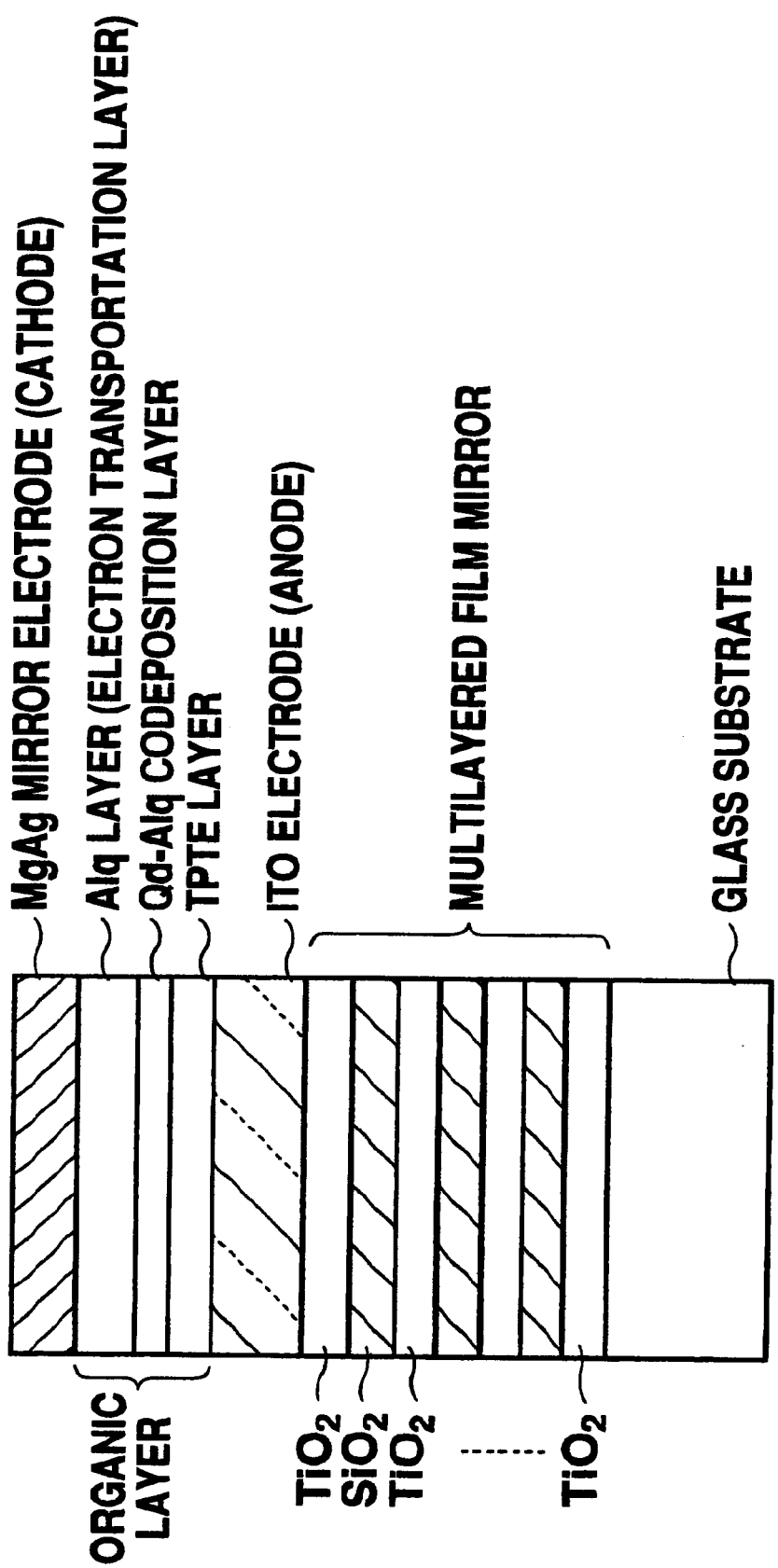
FIG. 11 is a diagram showing the configuration of the minute optical resonator type organic EL element according to an example of the invention.

FIG. 11 shows an example of the organic EL element of the present invention. In the organic EL element shown in FIG. 11, the multilayered film mirror was first formed on a cleaned glass substrate by alternately forming the $SiO_2$ film and the $TiO_2$ film each having a different refractive index (alternately four layers each to form eight layers in total) by a magnetron sputtering method. Here, a stop band (optical reflected wavelength area of the multilayered film i1h mirror) was set to a center wavelength of 570 nm, and the $SiO_2$ film and the $TiO_2$ film were set to a thickness of 97 nm and 60 nm respectively. The multilayered film mirror obtained as described above had a reflectivity of about 90%.

Next, the ITO electrode was formed to a thickness of $\lambda/2$ (film thickness 150 nm) as an anode electrode on the multilayered film mirror. Triphenylamine tetramer (TPTE) was then formed to a thickness of 60 nm as the electron hole transportation layer by a vacuum evaporation method with a degree of vacuum of $10^{-7}$ torr. In addition, the codeposition layer of alumiquinolinol complex (Alq) and quinacridone (Qd) were formed to a thickness of 20 nm, and the Alq layer of Alq only was formed to a thickness of 35 nm as the electron transportation layer, thereby forming the luminescent layer. As for quinacridone, methylated quinacridone having high reliability was used (see the chemical formula (1)). Finally, the MgAg mirror electrode was formed to a thickness of 150 nm on the luminescent layer.

By applying a voltage of 5V DC to between the ITO electrode and the MgAg mirror electrode of the organic EL element obtained as described above, a green luminescence having directivity toward the front of the element (lower side of FIG. 11) was obtained. The brightness of 30000 $cd/m^2$ was obtained when the drive voltage was raised to have the injection current of 500 $mA/cm^2$ (15V) into the luminescent layer, while the directivity toward the front of the element was maintained. Moreover, the lifetime of the element until the brightness was reduced to half could be improved to ten hours.

The organic material for the luminescent layer in the above-mentioned embodiment and the example is not limited to the low-molecular material, and a macro-molecular material such as poly-para-phenylenevinylene can-also be used.

In addition, the present invention can further enhance the reliability of the organic EL element by covering the organic EL element of the above-mentioned embodiment with a protection film made of an organic material or an inorganic material compound, and by sealing the element by an inert gas. Sealing of the element is not limited to the use of an inert gas, and a silicon-based or fluorine-based liquid can be used for sealing.

While there have been described what are at present considered to be preferred embodiments of the invention, it is to be understood that various modifications may be made thereto, and it is intended that the appended claims cover all such modifications as fall within the true spirit and scope of the invention.

What is claimed is:

1. An organic electroluminescent element having a minute optical resonator for amplifying a specific wavelength in a luminescence light comprising:

a substrate;

a multilayered film mirror formed between the substrate and said transparent electrode, each film having a different refractive index;

a transparent electrode as an anode on the multilayered film mirror;

an organic layer on the transparent electrode; and a metallic electrode mirror as a cathode on the organic layer, said organic layer comprising a luminescent layer for emitting a light by injecting holes and electrons through the transparent electrode and the metallic electrode mirror, said multilayered film mirror and said metallic electrode mirror constituting a minute optical resonator for amplifying a specific wavelength in the light, wherein the minute optical resonator has an optical length twice as long as a target amplified wavelength, the organic layer is not less than 100 nm thick, and the transparent electrode is not less than 50 nm thick, or is of not more than 30 Ω in sheet resistance;

the luminescent material of said luminescent layer has an emission spectrum with no luminescence component in a wavelength region of low order luminescence peak other than said target amplified wavelength; and the target amplified wavelength is in a range of about 30 nm toward a shorter wavelength side from a luminescence peak wavelength of the luminescent layer to a luminescence peak wavelength of the luminescent layer.

2. The organic electroluminescent element according to claim 1, wherein the transparent electrode has an optical thickness L of $\lambda/2$ with respect to the target amplified wavelength $\lambda$ provided that L is expressed as L=D×n wherein D is an actual film thickness D of the transparent electrode, and n is a refractive index of the transparent electrode.

3. The organic electroluminescent element according to claim 1, wherein the luminescent spectrum width is about 80 nm or less in half-width.

4. The organic electroluminescent element according to claim 1, wherein the luminescent layer comprises quinacridone.

5. The organic electroluminescent element according to claim 1, wherein the organic layer is not less than 115 nmn thick.

6. The organic electroluminescent element according to claim 1, wherein the thickness of the transparent electrode is greater than $\lambda/4$ and said optical thickness L satisfies the relationship $L=D \times n$ where D is the actual film thickness D.

7. An organic electroluminescent element having a minute optical resonator for amplifying a specific wavelength in a luminescence light comprising:

a substrate;

a multilayered film mirror formed on the substrate;

a transparent electrode as an anode on the multilayered film mirror;

an organic layer on the transparent electrode; and a metallic electrode mirror as a cathode on the organic layer, said organic layer comprising a luminescent layer for emitting a light by injecting holes and electrons through the transparent electrode and the metallic electrode mirror, said multilayered film mirror and said metallic electrode mirror constituting a minute optical resonator for amplifying a specific wavelength in the light, wherein the minute optical resonator has an optical length twice as long as a target amplified wavelength;

the organic layer is not less than 100 nm thick;

the transparent electrode is not less than 50 nm thick, or is of not more than 30 $\Omega$ in sheet resistance; and said target amplified wavelength is set so that the wavelength region of low order luminescence peak other than said target amplified wavelength is located outside the visual light region.

8. An organic electroluminescent element having a minute optical resonator for amplifying a specific wavelength in a luminescence light comprising:

a substrate;

a multilayered film mirror formed of laminated layers on the substrate, each of the layers having a different refractive index;

a transparent electrode as an anode on the multilayered film mirror;

an organic layer on the transparent electrode; and a metallic electrode mirror as a cathode on the organic layer, said organic layer comprising a luminescent layer for emitting a light by injecting holes and electrons through the transparent electrode and the metallic electrode mirror, said multilayered film mirror and said metallic electrode mirror constituting a minute optical resonator for amplifying a specific wavelength in the light, wherein the minute optical resonator has an optical length twice as long as a target amplified wavelength, the organic layer is not less than 100 nm thick, and the transparent electrode is not less than 50 nm thick, or is of not more than 30 $\Omega$ in sheet resistance; and the transparent electrode has an optical thickness L of $\lambda/2$ with respect to the target amplified wavelength $\lambda$ provided that L is expressed as $L=D \times n$, wherein D is an actual film thickness D of the transparent electrode, and n is a refractive index of the transparent electrode.

* * * * *